(12) United States Patent
Minnaert-Janssen et al.

(10) Patent No.: US 7,068,349 B2
(45) Date of Patent: Jun. 27, 2006

(54) METHOD OF AND PREVENTING FOCAL PLANE ANOMALIES IN THE FOCAL PLANE OF A PROJECTION SYSTEM

(75) Inventors: Ingrid Minnaert-Janssen, Veldhoven (NL); Johannes Jacobus Matheus Baselmans, Oirschot (NL); Frits Jurgen Van Hout, Retie (BE); Peter Van Oorschot, Eindhoven (NL); Christian Wagner, Eersel (NL); Adriaan Roelof Van Zwol, Eindhoven (NL); Roderik Willem Van Es, Geldrop (NL); Petrus Augustinus Marie Van Der Wielen, Stiphout (NL); Hubrecht Lodewijk Van Ginneken, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 112 days.

(21) Appl. No.: 10/830,406

(22) Filed: Apr. 23, 2004

(65) Prior Publication Data
US 2004/0263811 A1    Dec. 30, 2004

(30) Foreign Application Priority Data
Apr. 24, 2003 (EP) .................... 03252604

(51) Int. Cl.
*G03B 27/68* (2006.01)
*G03B 27/52* (2006.01)
(52) U.S. Cl. .......................... 355/52; 355/55
(58) Field of Classification Search ............ 355/52–53, 355/55; 356/401; 250/201.4; 378/4
See application file for complete search history.

(56) References Cited

U.S. PATENT DOCUMENTS

| | | | | |
|---|---|---|---|---|
| 4,342,917 A * | 8/1982 | Buckley | | 378/34 |
| 5,636,005 A * | 6/1997 | Yasuzato | | 355/71 |
| 6,163,365 A | 12/2000 | Takahashi | | 355/53 |
| 6,268,904 B1 | 7/2001 | Mori et al. | | 355/53 |
| 6,339,505 B1 * | 1/2002 | Bates | | 359/642 |
| 6,441,963 B1 * | 8/2002 | Murakami et al. | | 359/584 |
| 6,480,261 B1 * | 11/2002 | Cooper et al. | | 355/53 |
| 6,522,391 B1 * | 2/2003 | Katakura et al. | | 355/56 |
| 6,770,420 B1 * | 8/2004 | Dietliker et al. | | 430/270.1 |
| 6,859,260 B1 * | 2/2005 | Nelson et al. | | 355/55 |
| 6,894,766 B1 * | 5/2005 | West et al. | | 355/75 |
| 2004/0135980 A1 * | 7/2004 | Hill | | 355/52 |

OTHER PUBLICATIONS

D.L. Spears, High Resolution Pattern Replication Using Soft X-Rays, Feb. 24, 1972, Electronics Letters, vol. 8 No. 4, pp. 102-104.*

* cited by examiner

*Primary Examiner*—W. B. Perkey
*Assistant Examiner*—Vivian Nelson
(74) *Attorney, Agent, or Firm*—Pillsbury Winthrop Shaw Pittman, LLP

(57) ABSTRACT

To reduce and prevent local field anomalies created localized thinning of the coating of optical elements in the apparatus. The projection system is flood exposed to an intense beam of radiation for a substantial period of time. As the rate of thinning of the coating decreases with time, a uniform coating results.

24 Claims, 4 Drawing Sheets

METHOD OF AND PREVENTING FOCAL PLANE ANOMALIES IN THE FOCAL PLANE OF A PROJECTION SYSTEM

This application claims priority from EP application no. 03252604.8 filed Apr. 24, 2003, the contents of which is incorporated herein in its entirety.

BACKGROUND OF THE INVENTION

1. Field of the Invention

The present invention relates generally to a lithographic apparatus and more particularly to projection systems in a lithographic apparatus.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The radiation system may also encompass various types of optical components, including refractive, reflective, and catadioptric optical components for directing, shaping, or controlling the projection beam of radiation, and such components may also be referred to below, collectively or singularly, as a "lens."

Due to repeated, heavy use in the exposure of substrates the projection system degrades over time. Within the projection system there are individual optical elements such as refractive lenses, which can be made of quartz or flint or crown glass, or mirrors. These optical elements have coatings (the mirrors are generally embodied as substrates provided with a reflective coating), and repeated localized exposure (such as that used to expose substrates) causes specific areas of the optical element coating to change. Optically the effect is such that it appears as if the coating thins although the inventors are not entirely certain how, or why, such a change occurs. It could alternatively be due to a change in the structure of the coating. However, it will hereinafter be referred to as "thinning," "thin" or "thinned." The localized thinning therefore leads to aberrations in the focal plane of the optical element, and hence the projection system. In particular, the negative field curvature and astigmatism curvature of the projection system increases. As the field curvature and the astigmatism curvature of the optical elements increases the accuracy of the alignment and the exposure decreases. Prior to this invention correction and improvement of projection systems was generally only undertaken by the projection system manufacturer, thereby making it time consuming and expensive. Therefore, when the field curvature increases above a certain value the whole projection system must be replaced. Due to the high quality and accuracy necessary for the projection system, a new projection system is very expensive. It has therefore been a long felt want to provide a method of repairing the degradation due to repeated use of projection systems.

One aspect of embodiments of the present invention provides a method of at least partially repairing the degradation of projection systems due to repeated use.

This and other aspects are achieved according to embodiments of the invention by a method of decreasing focal plane anomalies of the focal plane of a projection system of a lithographic projection apparatus by flood exposing the projection system to an intense beam of radiation for a substantial period of time.

The flood exposure thins (or alternatively changes the structure of) the optical element coating. However, thinning does not occur at a constant rate and a limit is ultimately reached—further exposure does not cause further thinning of the optical element coating. Thus, the areas which were previously thinned due to substrate exposure are not thinned significantly further, but other areas are thinned to the same thickness. A uniform coating is therefore achieved and local anomalies in the focal plane due to thinning of the optical element coating are removed.

This provides a significant decrease in the field curvature. This process can therefore be applied to a projection system to improve the field curvature, and the lifetime of the projection system is significantly lengthened.

The radiation should preferably be electromagnetic radiation with a wavelength in the range 1 to 500 nm and for optimal results the projection system should be exposed to the radiation for at least 40 hours. During the exposure the reticle masking blades and aperture stops should be at their maximum potential. The intensity of the radiation should be similar to that used in substrate projection exposures. Ideally, this should be in a range of 500 to 6000 mW/cm$^2$.

The invention should preferably be carried out in a lithographic projection apparatus comprising a radiation system for providing a projection beam of radiation. Such apparatuses have been found by the inventors to be ideally suited to this process. Moreover, as the exposure takes place in situ there is no need for time to be spent on accurate repositioning of the projection system. Furthermore, if there is more than one projection system, or another optical element for which this is a suitable process, all of the optical elements in the apparatus will be healed in a single prolonged exposure. In such a lithographic apparatus as described in the opening paragraph the substrate table is often moveable and during the extended exposure should be continuously moved in order to evenly distribute heat. A blank wafer can be placed on the substrate table to reflect light back into the projection system.

This method may find particular benefit when used in Mercury I-line apparatus.

In addition to being used to improve optical elements in which anomalies are already present a similar method can be used to prevent focal plane anomalies due to optical element coating thinning. Prior to use, the projection system is flood exposed to an intense beam of radiation for a substantial period of time. The optical element coating is therefore thinned to such an extent that further (localized projection) exposures will not thin the coating any more, and focal plane anomalies due to coating thinning are eradicated.

There can be a computer program comprising program code means that, when executed on a computer system in connection with a lithographic projection apparatus instructs the lithographic projection apparatus to measure focal plane anomalies of the focal plane in the projection system of a lithographic projection apparatus, flood expose the projection system to an intense beam of radiation for a substantial period of time, and measure again the focal plane anomalies of the projection system. The focal plane anomalies measured can be field curvature of the focal plane.

According to a further aspect of embodiments of the invention there is a dummy mask comprising a plane glass plate for diverging radiation to fill the projection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm).

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which:

FIGS. 6, 7 and 8 are not to scale.

In the Figures, corresponding reference symbols indicate corresponding parts.

DETAILED DESCRIPTION OF THE PRESENT INVENTION

EMBODIMENT 1

Figure 1:
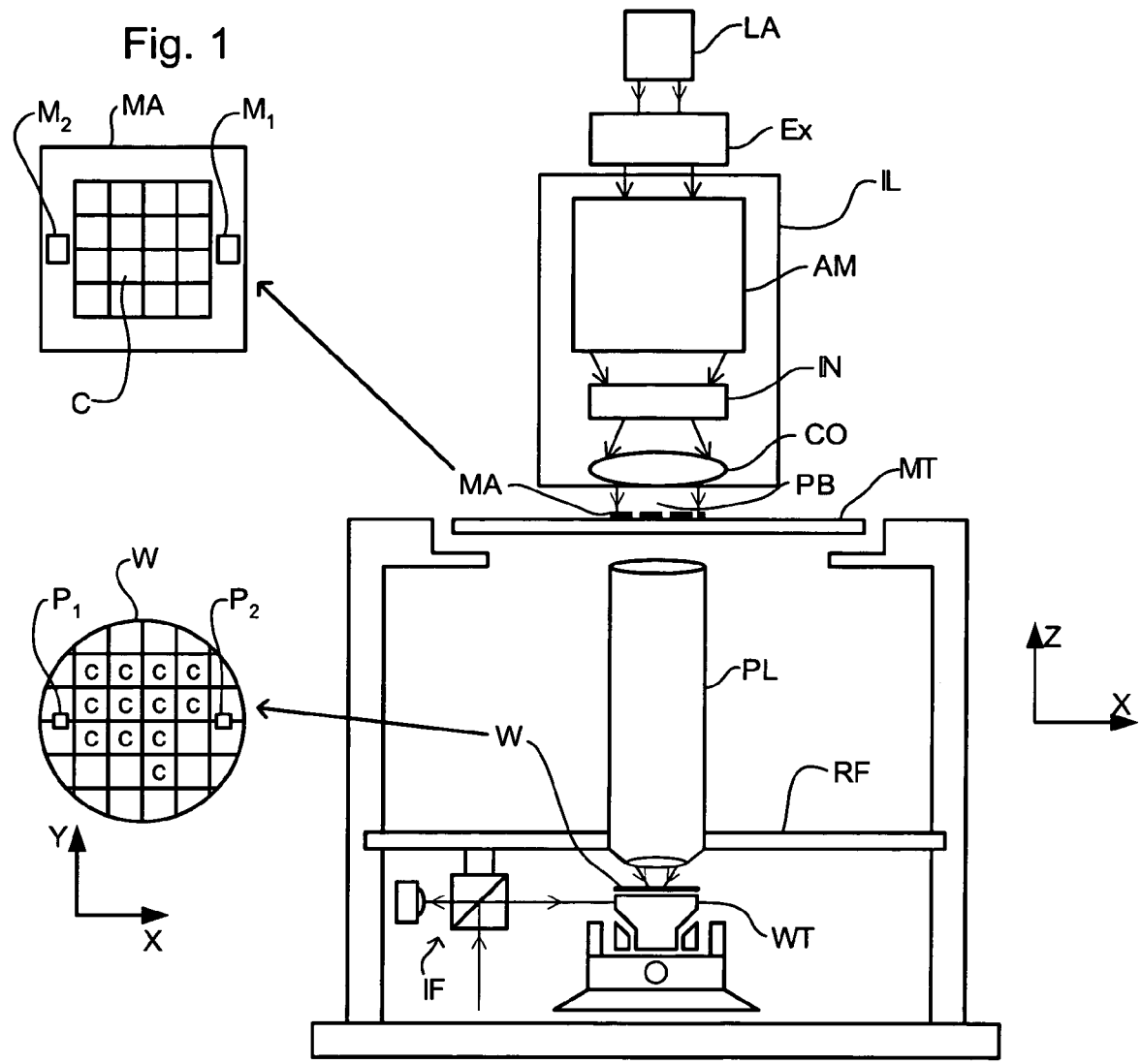
FIG. 1 depicts a lithographic projection apparatus in which the invention can be carried out.

FIG. 1 schematically depicts a lithographic projection apparatus according to a particular embodiment of the invention. The apparatus comprises: a radiation system Ex, IL, for supplying a projection beam PB of radiation (e.g., EUV radiation), which in this particular case also comprises a radiation source LA; a first object table (mask table) MT provided with a mask holder for holding a mask MA (e.g., a reticle), and connected to first positioning means for accurately positioning the mask with respect to item PL; a second object table (substrate table) WT provided with a substrate holder for holding a substrate W (e.g., a resist-coated silicon wafer), and connected to second positioning means for accurately positioning the substrate with respect to item PL; a projection system PL (e.g., a refractive) for imaging an irradiated portion of the mask MA onto a target portion C (e.g., comprising one or more dies) of the substrate W.

As here depicted, the apparatus is of a transmissive type (e.g., has a transmissive mask). However, in general, it may also be of a reflective type, for example (e.g., with a reflective mask). Alternatively, the apparatus may employ another kind of patterning devices, such as a programmable mirror array of a type as referred to above.

The source LA (e.g., an Hg lamp) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g., with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed by the mask MA, the beam PB passes through the projection system PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e., a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction," e.g., the y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
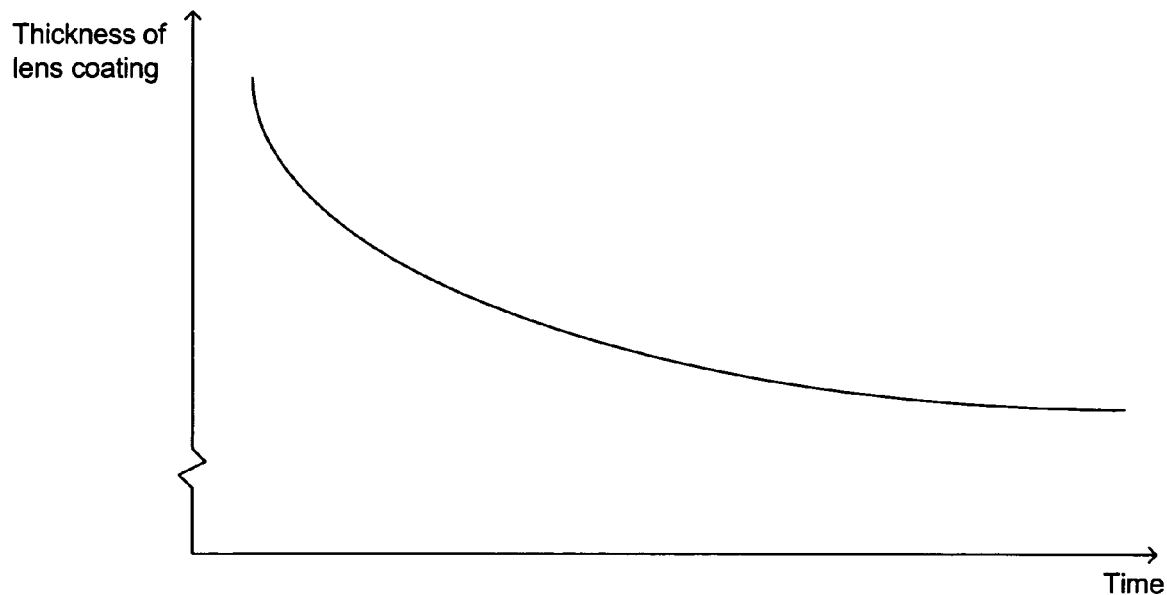
FIG. 2 shows the rate of thinning of a coating of an optical element.

After repeated exposures over a long time the field curvature of optical elements in the projection system increases. To maintain the field curvature of the projection system within acceptable limits the mask MA is removed from the lithographic projection apparatus. The radiation system is then operated at maximum power for at least 40, preferably 70 hours with the reticle masking blades and the aperture stops at their maximum potential. The coating of optical elements is thinned with time as shown in FIG. 2. The rate of thinning when an optical element is first exposed to radiation is relatively fast, and it then slows continuously until an equilibrium state is reached and more radiation will not thin the optical element coating any more. To prevent overheating of the apparatus the wafer table WT is continuously moved during the exposure. This distributes the heat evenly and prevents burning of the wafer table WT. To speed up the flood exposure a reflective wafer W is placed on the wafer table WT to reflect light back into the projection system PL. The reflective wafer can be patterned such that in addition it scatters, or diffracts or refracts radiation, whereby the scattering or diffraction or refraction is arranged to increase the spatial uniformity of the radiation at the optical elements of the projection system. Alternatively, instead of a wafer an aluminum substrate may be used.

Once the extended exposure has been completed, the mask can be replaced, and exposure of substrates can continue.

Alternatively, if the apparatus is of a reflective type, a fully reflective mask MA is placed on the mask table MT, in order to direct the radiation through the complete projection system.

Figure 3:
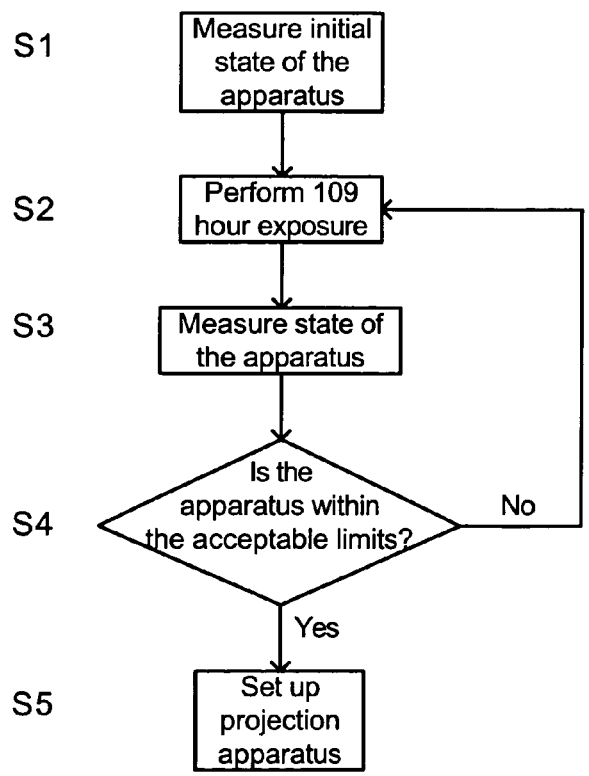
FIG. 3 shows steps involved in an embodiment of the invention.
Figure 4:
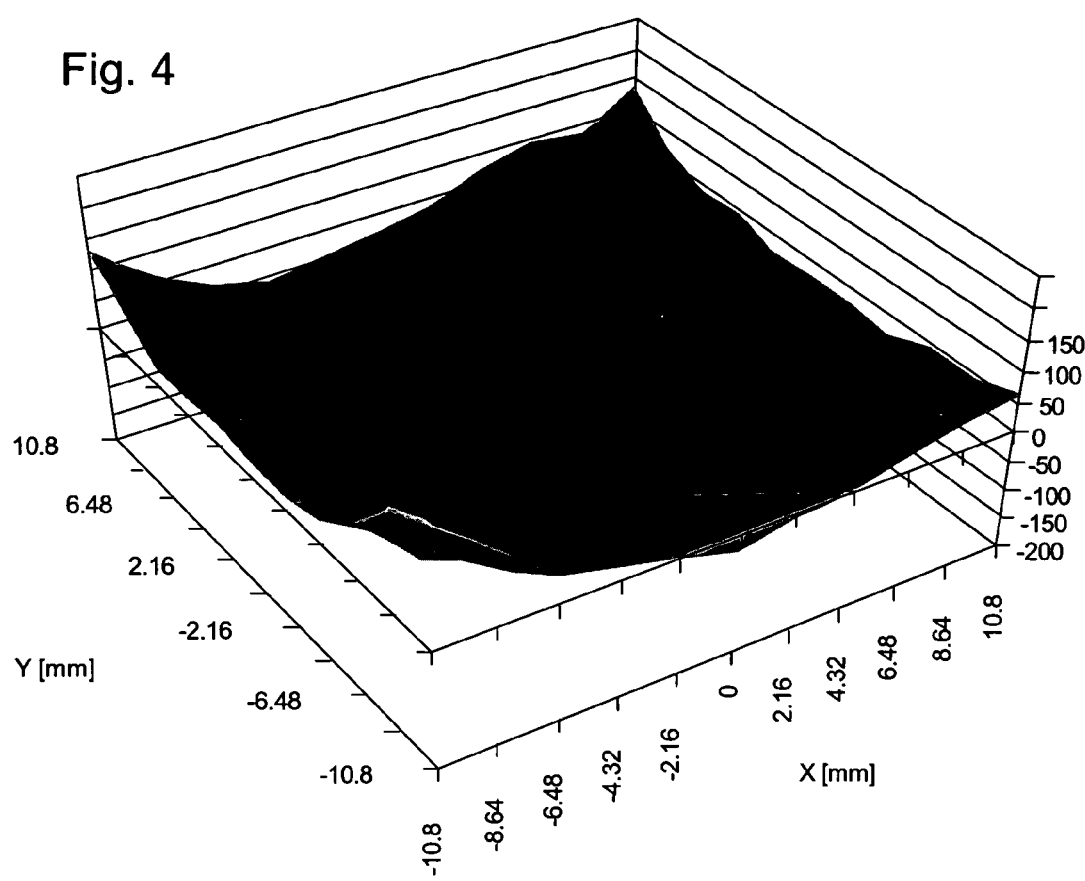
FIG. 4 shows the field curvature of a projection system after repeated exposure of substrates.
Figure 5:
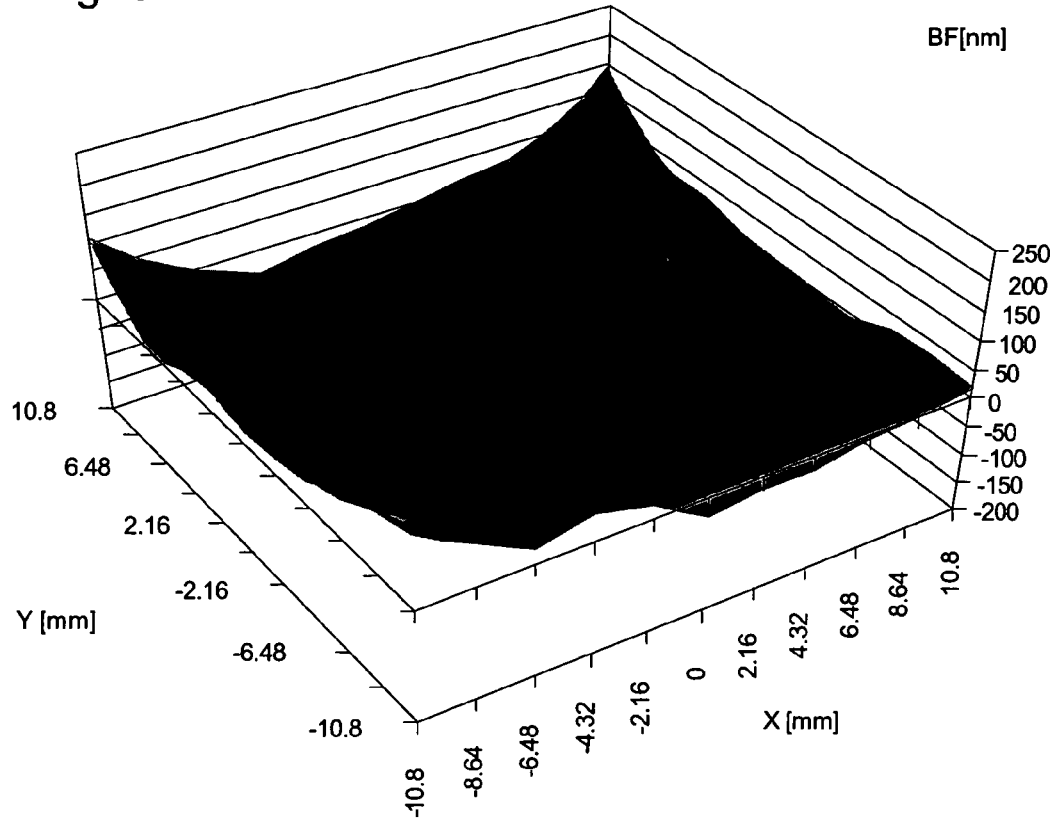
FIG. 5 shows the field curvature of the same projection system as shown in FIG. 4 with a reduced field curvature, after the method of the invention has been carried out.

To assess the success of the method a procedure as shown in FIG. 3 can be carried out. At step S1 the initial state of the apparatus is measured—this can include the focal aspects of the system, e.g., the total field curvature. A focal test is one in which the focal plane of the apparatus is found (ideally this should be flat). This can produce results such as those shown in FIG. 4 with a total field curvature of 105 nm (a significant fraction of the depth of focus of the apparatus). At step S2 a 109 hour exposure without the mask MA takes place. Then, at step S3 the state of the apparatus is again measured and the total field curvature found. A graph of the same apparatus as shown in FIG. 4, but after a 109 hour exposure is shown in FIG. 5. The field curvature has been reduced to 63 nm (a reduction of 40%). This is compared to set values in step S4. If the field curvature is not within acceptable limits steps S2, S3 and S4 are repeated until the field curvature is within acceptable limits. When the field curvature is within acceptable limits the projection apparatus is set up for exposure of substrates in step S5. In step S5 the mask MA would be replaced and the lithographic apparatus would be calibrated to ensure the mask MA and potential wafers W are accurately aligned.

The field curvature of the apparatus could also be measured prior to any exposure of the projection system to obtain a base reading for the field curvature of the projection system.

Figure 6:
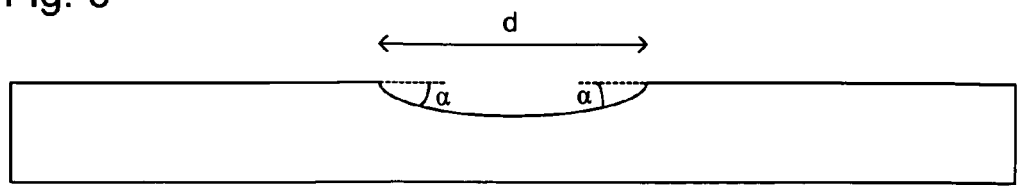
FIG. 6 shows a contoured optical element for use in a step-and-scan lithographic apparatus in accordance with an aspect of the invention.
Figure 7:
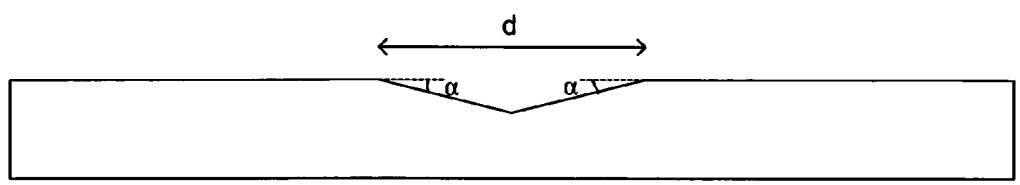
FIG. 7 shows an alternative contoured optical element for use in a step-and-scan lithographic apparatus.
Figure 8:
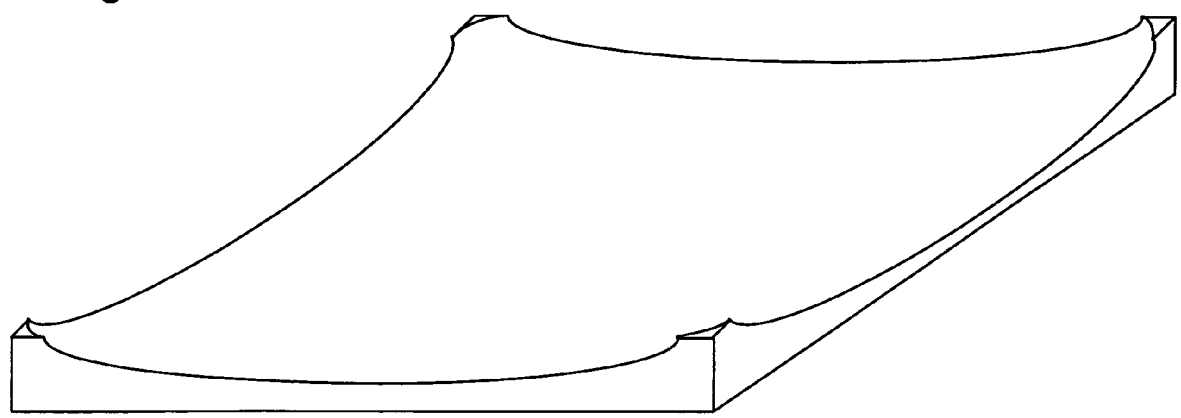
FIG. 8 shows a contoured optical element for use in a wafer stepper apparatus.

Alternatively, the extended exposure could take place with the mask, MA in place, or with a dummy mask containing specific contoured optical elements. The contoured optical elements are arranged to focus the radiation on specific areas of the coated optical element, and ensure that the radiation fills the projection system in order to optimize the benefits of the procedure. As shown in FIGS. 6, 7 and 8 these optical elements generally comprise a glass plate with a part removed. FIGS. 6 and 7 show optical elements used in a step-and-scan apparatus and FIG. 8 shows an optical element used in a wafer stepper apparatus. In FIG. 6 a curved groove has been removed and in FIG. 7 an element of triangular cross-section is removed. The acute angles, α, of the triangle and the curved groove should be approximately 8°. In both these cases the width, d, of the element removed is approximately that of the maximum illumination field when the lithographic apparatus is exposing substrates. In FIG. 8 a large bowl shaped element has been removed. These optical elements help to spread the light to ensure the whole projection system is exposed to the radiation. Once the extended exposure is completed the original mask MA must be replaced for exposure of the substrate. The extended lifespan of the projection system can lead to a substantial cost benefit.

In practice the nominal optical design of a high NA lithographic projection system in terms of lens-element thicknesses and radii of curvatures is such that any localized deviation from nominal thicknesses and or curvatures readily leads not only to a change of elementary paraxial projection-system characteristics such as magnification and the position of the focal plane (whereby a change of the focal plane is referred to generally as "defocus," i.e., a displacement of a focal plane along the optical axis), but also to a set of optical aberrations (fourth and higher order wave front aberrations) being out of tolerance. Such aberrations may be the field curvature and astigmatism curvature. The present invention, however, is not limited to decreasing focal plane anomalies such as a non-flatness of the focal plane. Although field curvature and astigmatism curvature are optical aberrations of the projection system relating to non-flatness of the focal plane, other aberrations not relating to non-flatness of the focal plane, such as for example distortion, can also be affected by a localized thinning of coatings, and become out of tolerance. By flood exposing the projection system to an intense beam of radiation for a substantial period of time this increase of aberrations out of tolerance can be alleviated.

While specific embodiments of the invention have been described above, it will be appreciated that the invention may be practiced otherwise than as described. The description is not intended to limit the invention.

The invention claimed is:

1. A method of decreasing focal plane anomalies of a focal plane of a projection system of a lithographic projection apparatus comprising:
   exposing the projection system to an intense beam of radiation for a substantial period of time until a rate of thinning of a coating of an optical element of the projection system is substantially reduced.

2. A method according to claim 1, further comprising exposing the projection system to said radiation for at least 40 hours.

3. A method according to claim 1, further comprising exposing the projection system to radiation of an intensity in the range of 500 to 6000 mW/cm$^2$.

4. A method according to claim 1, further comprising exposing the projection system to electromagnetic radiation with a wavelength in the range 1 to 500 nm.

5. A method of decreasing focal plane anomalies of the focal plane of a projection system of a lithographic projection apparatus comprising:
   exposing the projection system to an intense beam of radiation for a substantial period of time until a rate of thinning of a coating of an optical element of the projection system is substantially reduced, wherein the method is carried out in a lithographic projection apparatus comprising a radiation system for providing a projection beam of radiation.

6. A method according to claim 5, wherein the lithographic projection apparatus further comprises a substrate table for holding a substrate, and wherein the method further comprises continuously moving the substrate table during said exposing in directions substantially perpendicular to the direction of propagation of the radiation.

7. A method according to claim 5, further comprising exposing the projection system to radiation of an intensity in the range of 500 to 6000 mW/cm$^2$.

8. A method according to claim 5, further comprising exposing the projection system to electromagnetic radiation with a wavelength in the range 1 to 550 nm.

9. A method according to claim 5, wherein the lithographic projection apparatus is a mercury I-line apparatus.

10. A method of pre-treating a projection system to substantially prevent focal plane anomalies of the focal plane of a projection system of a lithographic projection apparatus due to optical element coating thinning comprising:
    exposing the projection system to an intense beam of radiation for a substantial period of time until a rate of thinning of a coating of an optical element of the projection system is substantially reduced.

11. A method according to claim 10, wherein the focal plane anomaly is a non-flatness of the focal plane.

12. A method according to claim 11, wherein the non-flatness of the focal plane is a field curvature.

13. A method according to claim 12, wherein the field curvature is a negative field curvature.

14. A method according to claim 12, wherein the field curvature is an astigmatism field curvature.

15. A method of decreasing optical aberrations of a projection system of a lithographic projection apparatus comprising:
    exposing the projection system to an intense beam of radiation for a substantial period of time until a rate of thinning of a coating of an optical element of the projection system is substantially reduced.

16. A method according to claim 15 whereby the optical aberration is distortion.

17. A method of decreasing focal plane anomalies of the focal plane of a projection system of a lithographic projection apparatus comprising:
    exposing the projection system to an intense beam of radiation for a substantial period of time until a rate of thinning of a coating of an optical element of the projection system is substantially reduced, said exposing being carried out in a lithographic projection apparatus comprising a radiation system for providing a projection beam of radiation and a substrate table for holding a substrate, and
    reflecting said intense beam of radiation back into the projection system during exposure with said substrate.

18. A method according to claim 17, wherein the reflective device is a wafer with a reflective coating.

19. A method according to claim 18, wherein the wafer is patterned with a structure arranged to increase the spatial uniformity of the radiation at the optical elements of the projection system during exposure, said structure comprising one or more structures from the group consisting of: scattering structures, diffracting structures or refracting structures.

20. A method according to claim 17, wherein the reflective device comprises an aluminum substrate.

21. A dummy mask comprising a plane glass plate for diverging radiation to fill a projection system.

22. A lithographic apparatus comprising a projection system and a machine readable medium comprising machine executable instructions for:

measuring focal plane anomalies of the focal plane in the projection system, and exposing the projection system to an intense beam of radiation for a substantial period of time when the measured focal plane anomalies exceed a preselected value.

23. An apparatus according to claim 22, wherein the focal plane anomaly is a non-flatness of the focal plane, or a field curvature, or a negative field curvature, or an astigmatism field curvature.

24. A method comprising:

measuring at least one focal plane anomaly of a focal plane in a projection optical system of a lithographic apparatus;

comparing the measured anomaly to a preselected threshold value; and when the measured anomaly exceeds the preselected threshold value, exposing the projection system to a beam of radiation so that a rate of thinning of a coating of an optical element of the projection optical system is substantially reduced.

* * * * *